(12) United States Patent
Chen et al.

(10) Patent No.: US 7,954,019 B2
(45) Date of Patent: May 31, 2011

(54) FLASH STORAGE DEVICE AND METHOD AND SYSTEM FOR TESTING THE SAME

(75) Inventors: Ban-Hui Chen, Hsinchu County (TW); Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 225 days.

(21) Appl. No.: 12/369,284

(22) Filed: Feb. 11, 2009

(65) Prior Publication Data

US 2010/0156448 A1    Jun. 24, 2010

(30) Foreign Application Priority Data

Dec. 24, 2008    (TW) .............................. 97150537 A

(51) Int. Cl.
*G11C 29/00* (2006.01)
*G11C 16/04* (2006.01)

(52) U.S. Cl. ................... 714/718; 365/185.33

(58) Field of Classification Search .................. 714/718, 714/799; 365/201, 200, 185.33
See application file for complete search history.

(56) References Cited

U.S. PATENT DOCUMENTS

| | | | |
|---|---|---|---|
| 7,702,831 B2 * | 4/2010 | Ma et al. ......................... | 710/74 |
| 7,702,984 B1 * | 4/2010 | Lee et al. ....................... | 714/742 |
| 7,802,155 B2 * | 9/2010 | Hiew et al. .................... | 714/718 |
| 2007/0285227 A1* | 12/2007 | Timothy et al. .......... | 340/539.13 |

* cited by examiner

*Primary Examiner* — Phung M Chung
(74) *Attorney, Agent, or Firm* — J.C. Patents

(57) ABSTRACT

A flash storage device and a testing method and a testing system for the flash storage device are provided. The testing system includes a testing apparatus and the flash storage device. The flash storage device includes a controller, a flash memory module, a plurality of peripheral pins and at least one test pin. The flash storage device receives an enable signal transmitted from the testing apparatus through the test pin. Subsequently, the controller outputs a signal to the testing apparatus through each peripheral pin based to the enable signal. Finally, the testing apparatus verifies the signal outputted by each peripheral pin.

25 Claims, 4 Drawing Sheets

FLASH STORAGE DEVICE AND METHOD AND SYSTEM FOR TESTING THE SAME

CROSS-REFERENCE TO RELATED APPLICATION

This application claims the priority benefit of Taiwan application serial no. 97150537, filed on Dec. 24, 2008. The entirety of the above-mentioned patent application is hereby incorporated by reference herein and made a part of specification.

BACKGROUND OF THE INVENTION

1. Field of the Invention

The present invention relates generally to a testing method, and more particularly, to a testing method for a flash storage device.

2. Description of Related Art

Digital cameras, cell phone cameras and MP3 markets have been growing rapidly these years, which leads to a rapid increase in the demand of storage medium. Because of characteristics of non-volatility, power-saving and having no mechanical structure, flash memories are suitable for portable use, especially for these battery-powered portable products. In addition to the portable products with built-in memories, memory cards can also be used in external products such as mini memory cards and USB flash drives. The memory cards on these external products may have a larger market because one user may have several USB flash drives and mini memory cards at the same time. Therefore, the flash memory industry has recently become a rather hot one among the electronic industries.

In general, before shipped, the flash memory will undergo a series of tests to ensure stability and compatibility of the flash memory. However, it has been the case that the flash memory is typically tested after packaged. As a result, it has not been possible to pre-determine whether or not the package of internal circuits has defects such as wire-bonding error or component being damaged.

Therefore, if peripheral pins have defects, the defects will be unknown until the final test step, which may lead to a waste of testing time and labor force. In addition, when there are too many circuits which have defects, a testing engineer cannot quickly classify the defected circuits to find the location where the package defect exists.

SUMMARY OF THE INVENTION

Accordingly, the present invention is directed to a testing system which transmits different enable signals via a testing apparatus to analyze an output status of each peripheral pin of a flash storage device.

In addition, the present invention is also directed to a flash storage device which pre-stores a group of machine instructions to test the flash storage device.

Further, the present invention is directed to a testing method which controls an output of each peripheral pin of the flash storage device based on different enable signals.

More specifically, an exemplary embodiment of the present invention provides a flash storage device comprising a plurality of peripheral pins, at least one test pin, a controller, a flash memory module and an instruction storage module. The controller comprises a test contact, a plurality of first control contacts and a plurality of second control contacts. The test contact is electrically connected to the test pin. Each of the first control contacts is connected to a corresponding one of the peripheral pins. The flash memory module comprises a plurality of module contacts. Each of the module contacts is connected to a corresponding one of the second control contacts. The instruction storage module is electrically connected to the controller and stores a plurality of machine instructions that are executable by the controller to perform a plurality of testing steps.

Another exemplary embodiment of the present invention provides a testing system comprising a flash storage device and a testing apparatus. The flash storage device comprises a plurality of peripheral pins, at least one test pin, a controller, a flash memory module and an instruction storage module. The controller comprises a test contact, a plurality of first control contacts and a plurality of second control contacts. The test contact is electrically connected to the test pin. Each of the first control contacts is connected to a corresponding one of the peripheral pins. The flash memory module comprises a plurality of module contacts. Each of the module contacts is connected to a corresponding one of the second control contacts. The instruction storage module is electrically connected to the controller and stores a plurality of machine instructions that are executable by the controller to perform a plurality of testing steps. In addition, the testing apparatus is electrically connected to the peripheral pins and the test pin such that an enable signal is transmitted to the test contact via the test pin and corresponding signals are received via the peripheral pins to verify the signals.

Another exemplary embodiment of the present invention further provides a testing method for a flash storage device which is suitable for the flash storage device. In the controller of the flash storage device, a first enable signal transmitted from the test pin is received via the test contact. Then, the first control contacts are controlled to output a plurality of test signals to the peripheral pins, respectively, based on the first enable signal, so as to verify whether or not the connection between each of the first control contacts and a corresponding one of the peripheral pins is correct based on the signals received by the peripheral pins. In the controller, a second enable signal transmitted from the test pin is received via the test contact when the connection between the first control contacts and the peripheral pins is correct. Then, an output of the flash memory module is received via the second control contacts based on the second enable signal, and the output of the flash memory module is subsequently transmitted to a corresponding one of the peripheral pins via at least one of the first control contacts so as to verify whether or not the connection between the second control contacts and the module contacts is correct based on the output of the flash memory module.

Another exemplary embodiment of the present invention provides a testing method for a flash storage device which is suitable for the above testing system. Firstly, the testing apparatus transmits a first enable signal to the test contact via the test pin. Then, in the controller, the first control contacts are controlled to output a plurality of test signals to the peripheral pins, respectively, based on the first enable signal. The testing apparatus then can determine whether or not the connection between each of the first control contacts and a corresponding one of the peripheral pins is correct based on receiving of the signals that was received by the peripheral pins. A second enable signal is transmitted to the test contact via the test pin when the testing apparatus verifies that the connection between the first control contacts and the peripheral pins is correct. The controller then receives an output of the flash memory module via the second control contacts based on the second enable signal, and subsequently transmits the output of the flash memory module to a corresponding one of the peripheral pins via at least one of the first control contacts so as to verify whether or not the connection between the second control contacts and the module contacts is correct based on the output of the flash memory module.

In view of the foregoing, the aspect of the present invention can first inspect whether or not the output of each peripheral pin is correct and thereby identify those defected pins before shipping of the flash storage device. As such, those defected circuits can be pre-sorted out, which avoids the waste of testing time and helps improve the process by reporting the defects back to the package manufacturer.

In order to make the aforementioned and other features and advantages of the present invention more comprehensible, exemplary embodiments accompanied with figures are described in detail below.

DESCRIPTION OF THE EXEMPLARY EMBODIMENTS

Figure 1A:
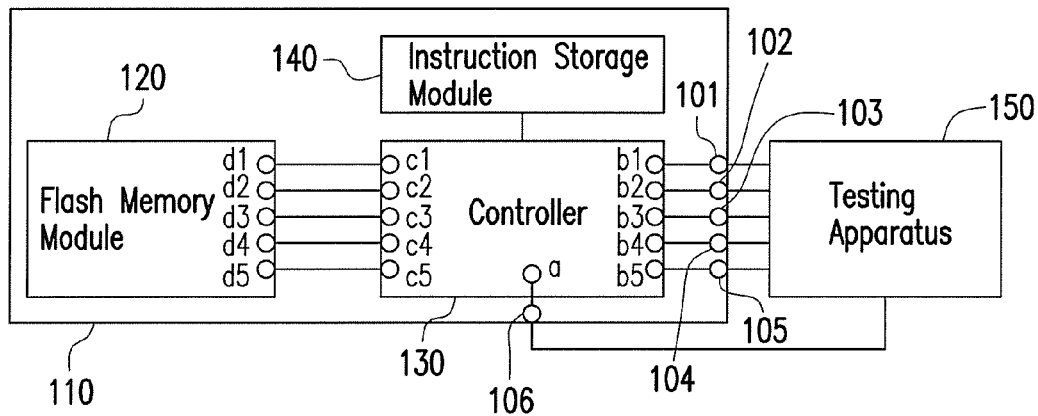
FIG. 1A is a block diagram of a testing system according to one exemplary embodiment of the present invention.

FIG. 1A is a block diagram of a testing system according to one exemplary embodiment of the present invention. Referring to FIG. 1A, the testing system includes a flash storage device 110 and a testing apparatus 150 for testing whether or not an internal package of the flash storage device 110 is correct.

The flash storage device 110 includes a plurality of peripheral pins 101~105, a test pin 106, a flash memory module 120, a controller 130, and an instruction storage module 140. The flash storage device 110 is a storage element which includes a plurality of dies having a controller within a same package. In the present exemplary embodiment, the flash storage device 110 is of, for example, a logical block addressing—NAND (LBA-NAND) type. However, the flash storage device 110 may also be of another type in alternative exemplary embodiments.

Figure 1B:
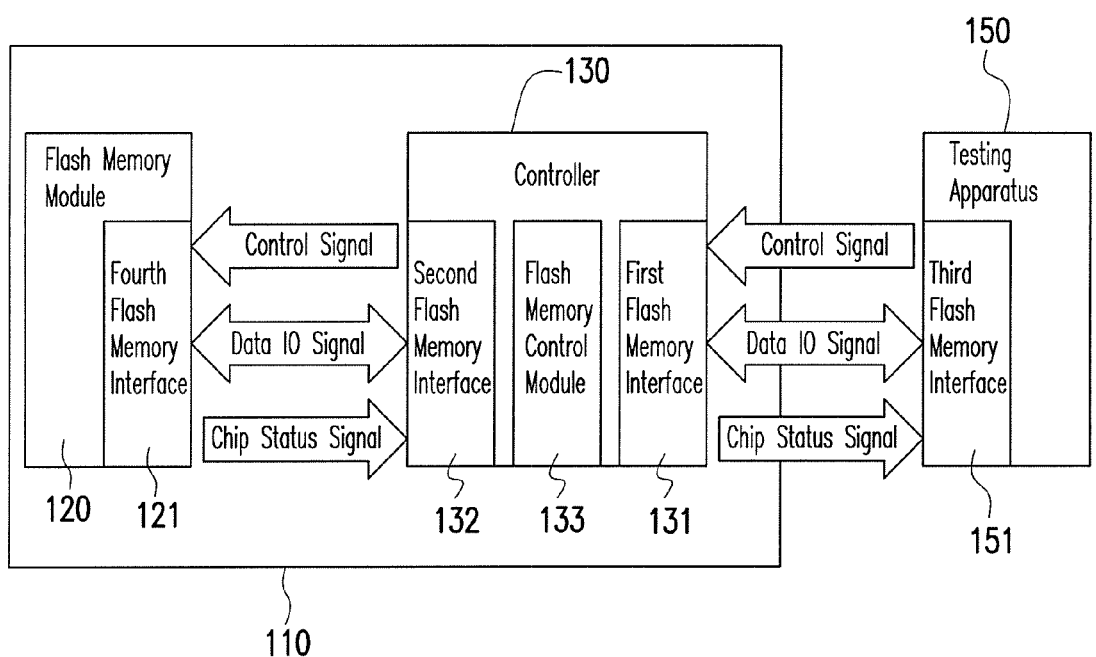
FIG. 1B is a schematic view illustrating signal transmission of a testing system according to one exemplary embodiment of the present invention.

In the present exemplary embodiment, the controller 130 of the flash storage device 110 includes at least two flash memory interfaces for electrical connection with the testing apparatus 150 and the flash memory module 120, respectively. FIG. 1B is a schematic view illustrating signal transmission of a testing system according to one exemplary embodiment of the present invention. Referring to FIG. 1B, the controller 130 includes a first flash memory interface 131, a second flash memory interface 132, and a flash memory control module 133. The first flash memory interface 131 is used to be electrically connected with an external apparatus (e.g., a host or testing apparatus 150). In the illustrated exemplary embodiment, the first flash memory interface 131 is used to be electrically connected with a third flash memory interface 151 of the testing apparatus 150. The second flash memory interface 132 is used to be electrically connected with a fourth flash memory interface 121 of the flash memory module 120.

Both the first flash memory interface 131 and the second flash memory interface 132 support flash memory interface signals. The flash memory interface signals include control signals, a data input/output signal IO and a chip status signal R/B. The control signals include a chip enable signal /CE, a command latch signal /CLE, an address latch signal /ALE, a data read control signal /RE, a data write control signal /WE, and a data write protect signal /WP. The flash memory control module 133 is used to control signal transmission between the first flash memory interface 131 and the second flash memory interface 132.

Referring again to FIG. 1A, in the present exemplary embodiment, the flash memory module 120, the controller 130 and the instruction storage module 140 are packaged in a single chip using a package standard such as land grid array (LGA), thin small out-line package (TSOP), or chip on board (COB). However, the present invention should not be limited to the exemplary exemplary embodiments described herein.

The controller 130 has a test contact a, first control contacts b1~b5 and second control contacts c1~c5. The flash memory module 120 has module contacts d1~d5. The test contact a and the first control contacts b1~b5 are contacts on the first flash memory interface 131, the second control contacts c1~c5 are contacts on the second flash memory interface 132, and the module contacts d1~d5 are contacts on the fourth flash memory interface 121. The test pin 106 is electrically connected to the test contact a of the controller 130. Each of the peripheral pins 101~105 is connected to a corresponding one of the first control contacts b1~b5. Each of the control contacts c1~c5 is connected to a corresponding one of the module contacts d1~d5.

The instruction storage module 140 is electrically connected to the controller 130 for storing a plurality of machine instructions executable by the controller 130 to perform a plurality of testing steps. In the present exemplary embodiment, the instruction storage module 140 is, for example, a boot ROM and may be disposed in the controller 130.

In the present exemplary embodiment, for ease of description, the drawing only shows the peripheral pins 101, 102, 103, 104 and 105 and the test pin 106 of the flash storage device 110. The number of each pin can be varied based on actual requirements and therefore the present invention should not be limited to the particular exemplary embodiment described herein. Here, the flash storage device 110 receives an enable signal transmitted from the testing apparatus 150 via the test pin 106 to thereby control outputs of the peripheral pins 101~105.

On the other hand, the testing apparatus 150 is electrically connected to the peripheral pins 101~105 and the test pin 106 of the controller 130 so as to receive outputs of the peripheral pins 101~105 and transmit an enable signal to the test pin 106.

In an alternative exemplary embodiment, the testing system may further employ a signal converter to transmit the signals outputted by the peripheral pins 101~105 to the testing apparatus 150 such that the testing apparatus 150 can read the outputs of all the peripheral pins 101~105 of the flash storage device 110 via a minimum number of pins.

Figure 1C:
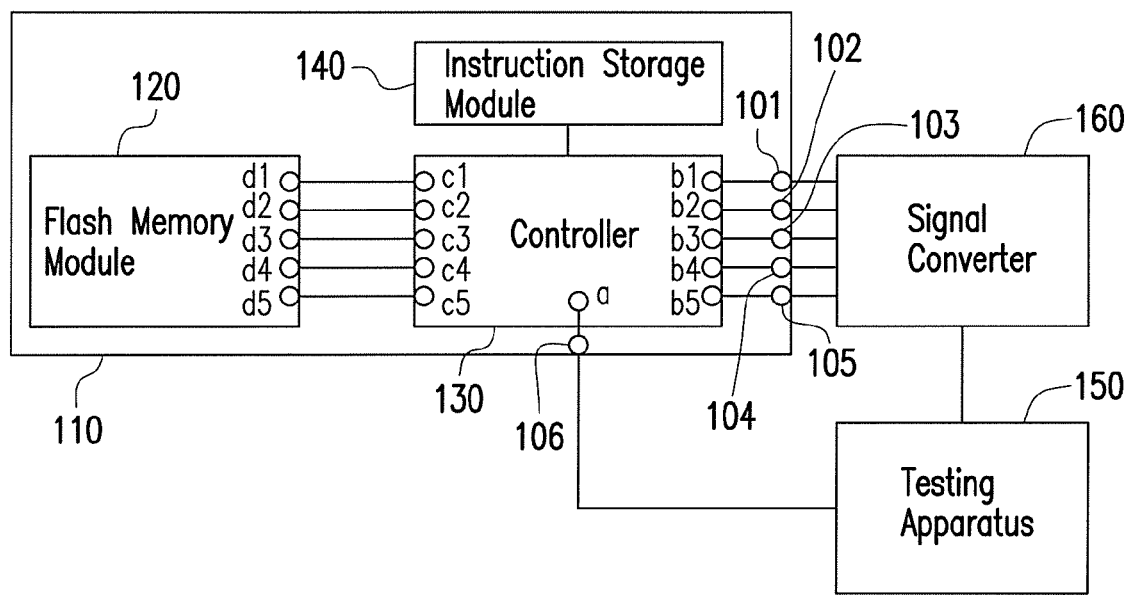
FIG. 1C is a block diagram of a testing system according to another exemplary embodiment of the present invention.

FIG. 1C is a block diagram of an exemplary testing system according to another exemplary embodiment of the present invention. Referring to FIG. 1C, the signal converter 160 includes a plurality of input ends and at least one output end. In the present exemplary embodiment, the input ends of the signal converter 160 are coupled to the peripheral pins 101~105 of the flash storage device 110, respectively, and the output end of the signal converter 160 is coupled to the testing apparatus 150. As such, the testing apparatus 150 can read the outputs of the peripheral pins 101~105 via a minimum number of pins.

Here, the signal converter 160 receives the signals of the peripheral pins 101~105 of the flash storage device 110 in a parallel manner. Subsequently, a data edit unit (not shown), such as a parallel-to-serial converting unit, is used to convert the signals to a serial data stream which is in turn outputted in a serial manner via a serial bus interface such as a serial peripheral interface (SPI) bus or an inter-integrated circuit (I2C) bus. In the present exemplary embodiment, the serial bus is an I2C bus. In addition, it should be noted that the data editing unit may also use another encoding scheme or algorithm to reduce the output pin number of the signal converter 160.

Therefore, if the testing apparatus 150 originally requires five pins to receive the signals of the peripheral pins 101~105 of the flash storage device 110, with the processing of the signal converter 160, the testing apparatus 150 would need only one serial data (SDA) pin to receive the signals of the peripheral pins 101~105 and a serial clock (SCL) pin to receive a clock signal. Here, the function of the remaining elements of the testing apparatus of FIG. 1B is the same as that of FIG. 1A and explanation thereof is therefore not repeated.

Figure 2:
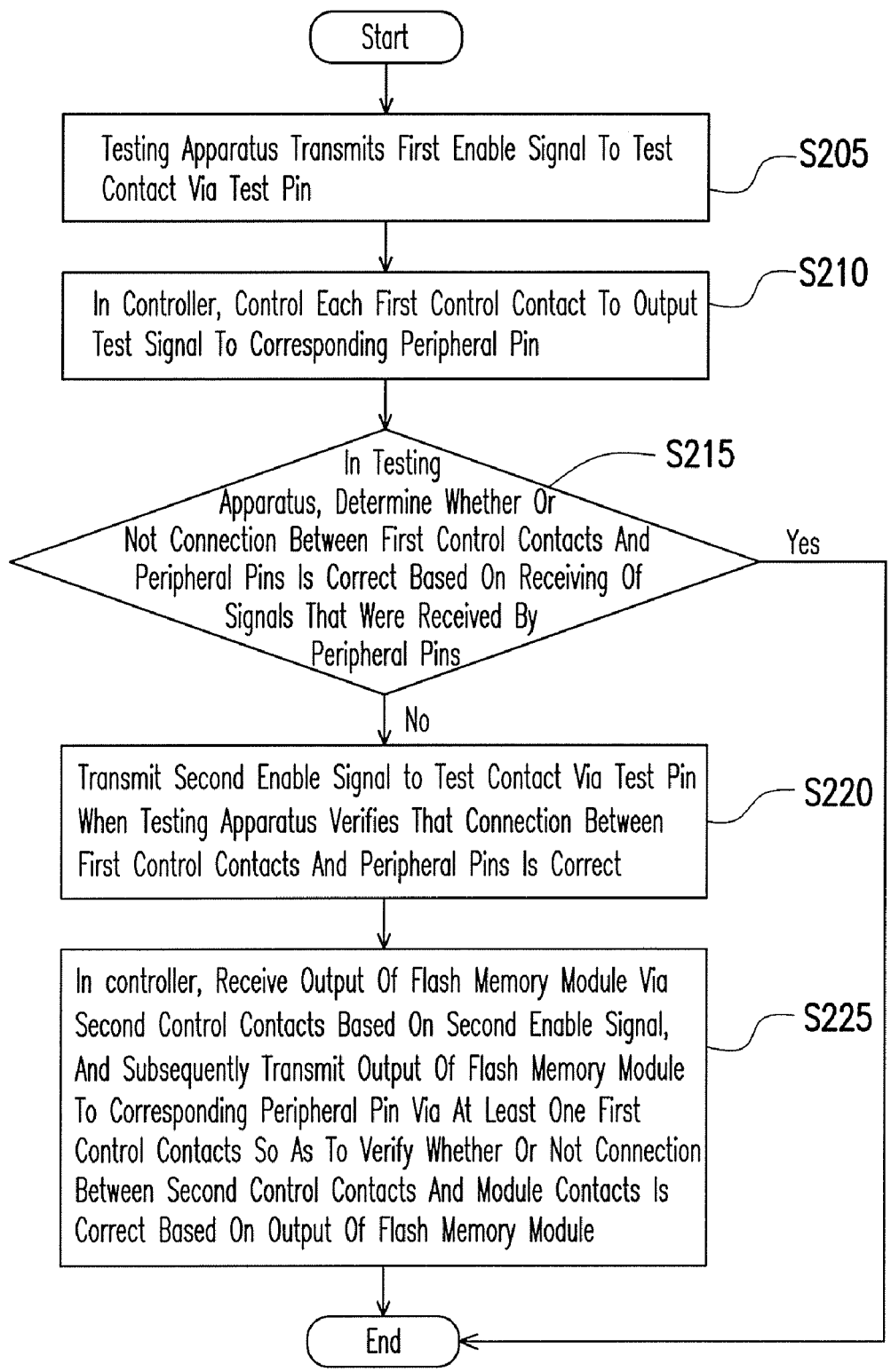
FIG. 2 is a flow chart of a testing method according to one exemplary embodiment of the present invention.

The present invention also provides a testing method corresponding to the testing system described above. The testing method is described in detail in a further exemplary embodiment below in conjunction with the elements of the above-described testing system. FIG. 2 is a flow chart of a testing method according to one exemplary embodiment of the present invention. Referring to both FIGS. 1A and 2, in the present exemplary embodiment, relevant machine instructions are compiled, for example, with program language and are stored in the instruction storage module 140. As the flash storage device 110 starts operating, the controller 130 performs the following testing procedure by executing the machine instructions in the instruction storage module 140 in conjunction with the testing apparatus 150.

Firstly, at step S205, the testing apparatus 150 transmits the first enable signal to the test contact a via the test pin 106. For example, when the testing apparatus 150 is connected to the flash storage device 110, the testing apparatus 150 may first transmit a group of specific signals to enable the test pin 106 to receive the enable signal transmitted from the testing apparatus 150.

Then, at step S210, the controller 130 controls the first control contacts b1~b5 to output test signals to the peripheral pins 101~105, respectively, based on the first enable signal, and transmits the outputted test signals to the testing apparatus 150.

Here, when the controller 130 monitors that the testing pin 106 receives the first enable signal, the machine instructions in the instruction storage module 140 are executed such that the peripheral pins 101~105 of the flash storage device 110 output test signals corresponding to the first enable signal to the testing apparatus 150. The testing apparatus 150 stores preset data that should be generated by the peripheral pins 101~105 corresponding to various enable signals. As such, the testing apparatus 150 is able to verify whether or not the signals received from the peripheral pins 101~105 are correct.

Thereafter, at step S215, in the testing apparatus 150, it is determined whether or not the connection between the first control contacts b1~b5 and the peripheral pins 101~105 is correct based on the signals received from the peripheral pins 101~105. In other words, when the connection between the first control contacts b1~b5 and the peripheral pins 101~105 is correct, the test signals outputted by the peripheral pins 101~105 are matched with the preset data stored in the testing apparatus 150. In this case, the method then proceeds forward to step S220. On the contrary, when the connection between the first control contacts b1~b5 and the peripheral pins 101~105 is incorrect, the test signals outputted by the peripheral pins 101~105 are not matched with the preset data stored in the testing apparatus 150. In this case, the entire testing procedure is ended and the testing apparatus 150 may further output an alert message to inform the user of the incorrect connection between the first control contacts b1~b5 and the peripheral pins 101~105.

At step S220, when the testing apparatus 150 verifies that the connection between the first control contacts b1~b5 and the peripheral pins 101~105 is correct, the testing apparatus 150 transmits the second enable signal to the test contact a via the test pin 106.

Thereafter, at step S225, in the controller 130, the output of the flash storage device 110 is received via at least one of the second control contacts c1~c5 based on the second enable signal, such that the controller 130 transmits the output of the flash memory 120 to the testing apparatus 150 via at least one of the first control contacts b1~b5 to verify whether or not the connection between the second control contacts c1~c5 and the module contacts d1~d5 is correct.

It should be noted that the first enable signal is, for example, a logic low signal, a logic high signal, or a clock signal. When the first enable signal is a logic low signal, the peripheral pins 101~105 output a first group of test signals. When the enable signal is a logic high signal, the peripheral pins 101~105 output a second group of test signals (e.g., the second group of test signals may be obtained by inverting the first group of test signals). When the first enable signal is a clock signal, one of the peripheral pins outputs one of a logic high signal and a logic low signal, while the rest of the peripheral pins each output the other of the logic high signal and the logic low signal.

Figure 3:
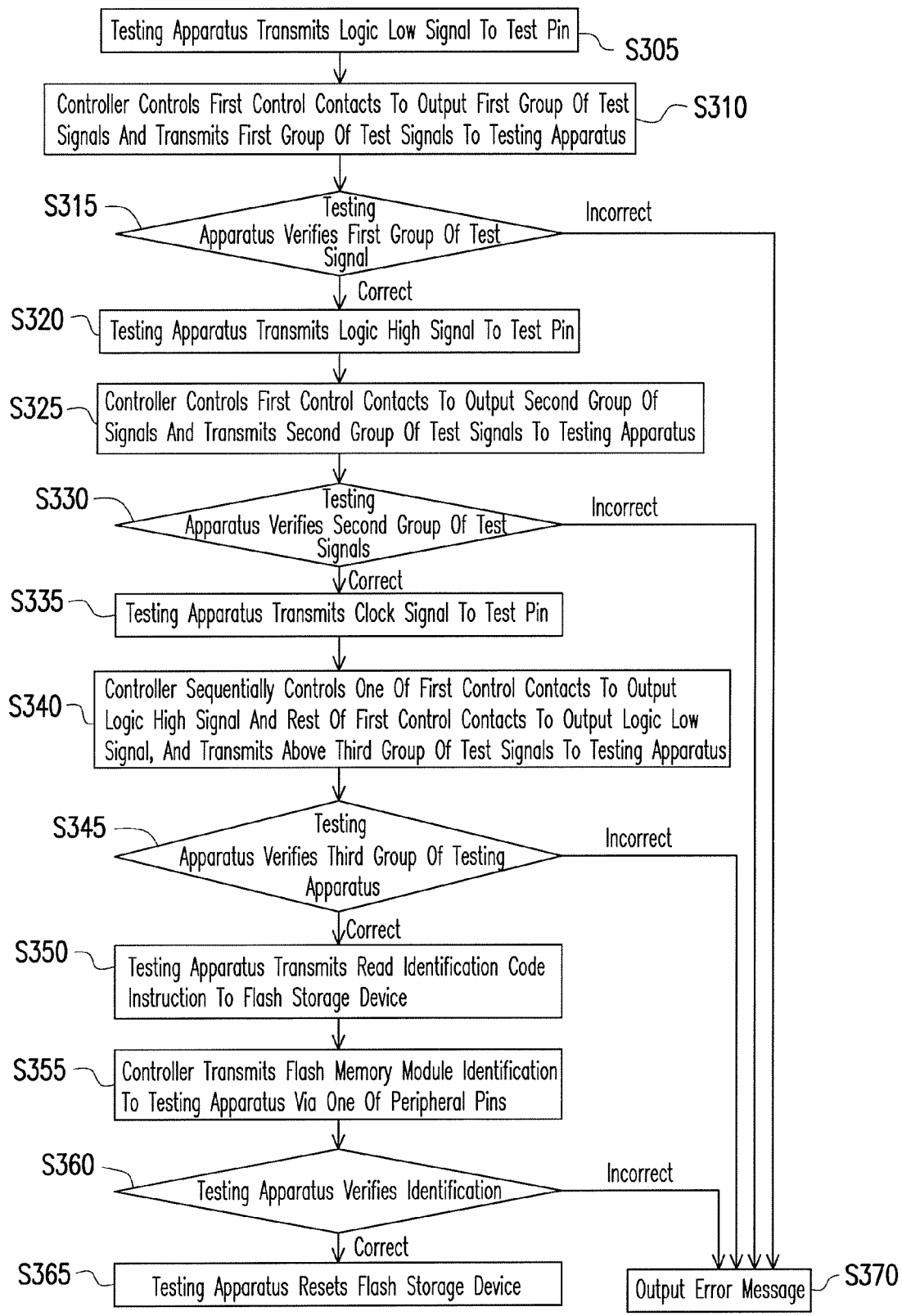
FIG. 3 is a flow chart of a testing method according to another exemplary embodiment of the present invention.

Below, a further exemplary exemplary embodiment of the present testing method is described below in detail in which the logic low signal, logic high signal and clock signal are used. FIG. 3 is a flow chart of a testing method according to another exemplary embodiment of the present invention. Referring to both FIGS. 1A and 3, firstly, at step S305, the testing apparatus 150 transmits a logic low signal to the test pin 106. When receiving the logic low signal via the test contact a, the controller 130 controls the first control contacts b1~b5 to output a first group of test signals and transmits these test signals to the testing apparatus 150 via the peripheral pins 101~105 at step S310.

Thereafter, at step S315, the testing apparatus 150 verifies whether or not the first group of signals is matched with the preset data. When the first group of test signals is verified as correct, the testing apparatus 150 transmits a logic high signal to the test pin 106. On the contrary, when one of the first group of signals is not matched with the preset data, an error message is outputted at step S370.

For example, it is assumed the peripheral pins 101~105 should output in sequence the test signals of 1, 0, 1, 0, 1. If the peripheral pins 101~105 output 1, 0, 1, 0, 1, the method then proceeds forward to step S320. If the peripheral pins 101~105 output 1, 1, 0, 0, 1, it represents that errors occur at the peripheral pins 102, 103 and it is thereby presumed that the circuit connection between the peripheral pins 102, 103 and the corresponding first control contacts b2, b3 may have a defect, such as, open-circuit, short-circuit, or connection error.

Next, when the controller 130 receives the logic high signal via the test contact a, the control 130 controls the first control contacts b1~b5 to output a second group of test signals and transmits the second group of test signals to the testing apparatus 150 via the peripheral pins 101~105 at step S325. In other words, when the testing apparatus 150 verifies that the first group of test signals outputted by the peripheral pins 101~105 is correct, the voltage level of the test pin 106 is pulled up to the logic high level such that the peripheral pins 101~105 output the second group of test signals. Here, the second group of test signals is obtained by inverting the first group of test signals.

Thereafter, at step S330, the testing apparatus 150 verifies the second group of test signals. When the second group of test signals is verified to be correct, the testing apparatus 150 transmits a clock signal to the test pin 106 at step S335. On the contrary, when one of the second group of test signals is verified to be incorrect, an error message is outputted at step S370.

For example, it is assumed the peripheral pins 101~105 should output in sequence the test signals of 0, 1, 0, 1, 0. If the peripheral pins 101~105 output 0, 1, 0, 1, 0, the method then proceeds forward to step S320. If the peripheral pins 101~105 output 0, 0, 0, 1, 0, it represents that an error occurs at the peripheral pin 102 and it is thereby presumed that the circuit connection between the peripheral pin 102 and the corresponding first control contact b2 may have a defect, such as, open-circuit, short-circuit, or connection error.

Then, when the controller 130 receives the clock signal via the test contact a, the flash storage device 110 enters a sequential test mode. At step S340, the controller 130 sequentially controls one of the first control contacts to output a logic high signal and each of the rest of the first control contacts to output a logic low signal so as to transmit a third group of test signals to the testing apparatus 150. For example, the first control contact b1 is first set as 1, and the rest of the first control contacts b2~b5 are set as 0. Next, the first control contact b2 is set as 1, and the rest of the first control contacts b1, b3~b5 are set as 0. Later settings of the first control contacts are set by analogy.

Thereafter, at step S345, the testing apparatus 150 verifies the third test signals outputted by the peripheral pins 101~105. When the third group of test signals is verified to be correct, the method proceeds to step S350. On the contrary, when one of the third test signals is verified to be incorrect, an error message is outputted at step S370. For example, when one peripheral pin which should have a level status of 1 does not have a level status of 1, short-circuit may occur on this peripheral pin or between this peripheral pin and another peripheral pin. In addition, when more than one peripheral pins have a level status of 1, short-circuit may occur between the peripheral pins.

For example, it is assumed that the peripheral pins 101~105 should output in sequence the third test signals of 0, 0, 0, 0, 1. When the peripheral pins output 0, 0, 0, 0, 1, the method proceeds forward to step S350. When the peripheral pins 101~105 output 0, 0, 0, 1, 1, it may represent that short-circuit may occur between the peripheral pins 104 and 105.

In addition, after the signals are verified to be correct at step S345, the signals outputted by the first control contacts b1~b5 can all be inverted and verified once again. That is, one of the first control contacts is set as 0, and each of the rest of the first control contacts is set as 1, and later settings of the control contacts are set by analogy till all the first control contacts are tested. In alternative exemplary embodiments, when the controller 130 receives the clock signal, one of the first control contacts may also be set as 0 and each of the rest of the first control contacts may be set as 1, and it is optional to subsequently invert the signals outputted by the first control contacts b1~b5 and verify the inverted signals once again.

After the whole testing procedure has been performed, it can be determined that the arrangement and signal transmission of the controller 130 and peripheral pins 101~105 of the flash storage device 110 have no defects. In other words, the connection between the first control contacts b1~b5 and the peripheral pins 101~105 of the controller 130 has no defects.

Then, at step S350, the testing apparatus 150 transmits a identification-reading instruction (e.g., Read Flash ID) to the flash storage device 110. Here, after receiving the identification-reading instruction via the test contact a, the controller 130 informs the flash memory module 120 via at least one of the second control contacts c1~c5. The flash memory module 120 then turns an identification back to the controller 130 via at least one of the module contacts d1~d5.

Thereafter, at step S355, the controller 130 transmits the identification of the flash memory module 120 to the testing apparatus 150 via the peripheral pins 101~105. At step S360, the testing apparatus 150 then verifies whether or not the identification is correct to determine whether or not the connection between the module contacts d1~d5 of the flash memory module 120 and the second control contacts c1~c5 of the controller 130 is correct. For example, after receiving the identification-reading instruction, the controller 130 reads the identification of the flash memory module 120 from a preset address and outputs the identification to the second control contacts c1~c5 of the controller 130 in a parallel manner via the module contacts d1~d5.

If the identification is verified to be correct, it represents that the connection between the module contacts d1~d5 and the second control contacts c1~c5 is correct. At step S365, the testing apparatus 150 then resets the flash storage device 110 such that the flash storage device 110 enters a normal mode. On the contrary, when the identification verification is failed, it represents that the connection between the flash memory module 120 and the controller 130 has a defect and then an error message is outputted at step S370.

It should be noted that, in an alternative exemplary embodiment, after receiving the second enable signal, the controller 130 reads data at a specific address of the flash memory module 120 and transmits the data to at least one of the second control contacts c1~c5 via at least one of the module contacts d1~d5. The controller 130 then compares the received data to preset data. In addition, the second enable signal may also enable the controller 130 to read multiple pieces of test data of the flash memory module 120 and compare each piece of test data to corresponding preset data to verify whether or not the connection between the second controller contacts c1~c5 and the module contacts d1~d5 is correct.

In addition, after the testing apparatus 150 verifies the signals to be correct, the testing apparatus 150 may further transmit a third enable signal to the test pin 106 such that the controller 130 ignores the signal received by the test pin 106. For example, after receiving the third enable signal, the controller 130 declares not to act upon the signal of the test pin 106 such that the controller 130 disables the test pin 106 to avoid misoperation in the future.

In summary, the testing apparatus and the flash storage device interact with each other in the present invention and the status of the peripheral pins of the flash storage device is read and analyzed by the testing apparatus. As such, those circuits that have no defects or have defects can be pre-sorted out thus reducing the time for testing. In addition, the location where detects occur can be correctly located and the detects can thus be returned to the package manufacturer to improve the manufacturing process. Furthermore, the signal converter can be used such that the testing apparatus can detect all the pins of the flash storage device using a minimum number of pins thus reducing the number of the pins of the testing apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A testing method for a flash storage device, the flash storage device comprising at least one test pin, a plurality of peripheral pins, a controller, and a flash memory module, the test pin being electrically connected to a test contact of the controller, each of the peripheral pins being connected with a corresponding one of a plurality of first control contacts of the controller, each of a plurality of second control contacts of the controller being connected with a corresponding one of a plurality of module contacts of the flash memory module, the testing method comprising:
   receiving a first enable signal transmitted from the test pin via the test contact of the controller;
   controlling the first control contacts to output a plurality of test signals to the peripheral pins, respectively, based on the first enable signal, so as to verify whether or not the connection between the first control contact and the peripheral pins is correct based on the signals received by the peripheral pins;
   receiving a second enable signal transmitted from the test pin via the test contact of the controller when the connection between the first control contacts and the peripheral pins is correct; and
   receiving an output of the flash memory module via the second control contacts based on the second enable signal, and subsequently transmitting the output of the flash memory module to a corresponding one of the peripheral pins via at least one of the first control contacts so as to verify whether or not the connection between the second control contacts and the module contacts is correct based on the output of the flash memory module.

2. The testing method according to claim 1, wherein the first enable signal is one of a logic low signal, a logic high signal, and a clock signal.

3. The testing method according to claim 2, wherein the step of controlling the first control contacts to output a plurality of test signals to the peripheral pins, respectively, based on the first enable signal, comprises:
   controlling the first control contacts to output a plurality of first test signals to the peripheral pins, respectively, when the first enable signal is one of a logic low signal and a logic high signal; and
   controlling the first control contacts to output a plurality of second test signals to the peripheral pins, respectively, when the first enable signal is the other of the logic low signal and the logic high signal, wherein the second test signals are inverted signals of the first test signals.

4. The testing method according to claim 2, wherein the step of controlling the first control contacts to output the test signals to the peripheral pins, respectively, comprises:
   sequentially setting one of the first control contacts to output one of a logic high signal and a logic low signal, and setting each of the rest of the first control contacts to output the other of the logic high signal and the logic low signal when receiving the first enable signal.

5. The testing method according to claim 1, wherein the second enable signal is an identification-reading instruction, and the output of the flash memory module is an identification.

6. The testing method according to claim 1, further comprising disabling the test pin.

7. A testing method for a flash storage device, adapted for a testing system comprising a testing apparatus and the flash storage device, the flash storage device comprising at least one test pin, a plurality of peripheral pins, a controller, and a flash memory module, the peripheral pins being electrically connected to the testing apparatus, the test pin being electrically connected to a test contact of the controller, each of the peripheral pins being connected with a corresponding one of a plurality of first control contacts of the controller, each of a plurality of second control contacts of the controller being connected with a corresponding one of a plurality module contacts of the flash memory module, the testing method comprising:
   transmitting a first enable signal to the test contact by the testing apparatus via the test pin;
   controlling the first control contacts of the controller to output a plurality of test signals to the peripheral pins, respectively, based on the first enable signal;
   determining whether or not the connection between the first control contacts and the peripheral pins is correct by the testing apparatus based on receiving of the signals that were received by the peripheral pins;
   transmitting a second enable signal to the test contact via the test pin by the testing apparatus when the testing apparatus verifies that the connection between the first control contacts and the peripheral pins is correct; and
   receiving an output of the flash memory module via the second control contacts of the controller based on the second enable signal, and subsequently transmitting the output of the flash memory module to a corresponding one of the peripheral pins via at least one of the first control contacts so as to verify whether or not the connection between the second control contacts and the module contacts is correct based on the output of the flash memory module.

8. The testing method according to claim 7, wherein the first enable signal is one of a logic low signal, a logic high signal, and a clock signal.

9. The testing method according to claim 8, wherein, in the controller, the step of controlling the first control contacts to output a plurality of test signals to the peripheral pins, respectively, based on the first enable signal, comprises:
   controlling the first control contacts to output a plurality of first test signals to the peripheral pins, respectively, when the first enable signal is one of a logic low signal and a logic high signal; and
   controlling the first control contacts to output a plurality of second test signals to the peripheral pins, respectively, when the first enable signal is the other of the logic low signal and the logic high signal, wherein the second test signals are inverted signals of the first test signals.

10. The testing method according to claim 8, wherein, in the controller, the step of controlling the first control contacts to output the test signals to the peripheral pins, respectively, comprises:
   when receiving the first enable signal, sequentially setting one of the first control contacts to output one of a logic high signal and a logic low signal, and setting each of the rest of the first control contacts to output the other of the logic high signal and the logic low signal.

11. The testing method according to claim 7, wherein the second enable signal is an identification-reading instruction, and the output of the flash memory module is an identification.

12. The testing method according to claim 7, wherein, after the testing apparatus verifies that the output of the flash memory module is correct, the method further comprises:
transmitting a third enable signal by the testing apparatus via at least one of the peripheral pins to a corresponding one of the first control contacts of the controller such that the controller ignores the signal received by the test pin.

13. A flash storage device comprising:
a plurality of peripheral pins;
at least one test pin;
a controller comprising a test contact, a plurality of first control contacts and a plurality of second control contacts, the test contact being electrically connected to the test pin, each of the first control contacts being connected to a corresponding one of the peripheral pins;
a flash memory module comprising a plurality of module contacts, each of the module contacts being connected to a corresponding one of the second control contacts; and
an instruction storage module electrically connected to the controller and storing a plurality of machine instructions that are executable by the controller to perform at least one testing step, the at least one testing step comprising:
controlling each of the first control contacts with the controller to output at least one test signal to a corresponding one of the peripheral pins based on a first enable signal when the controller receives the first enable signal, so as to verify whether or not the connection between the first control contacts and the peripheral pins is correct based on the test signals.

14. The flash storage device according to claim 13, wherein the testing steps further comprises controlling an output of the flash memory module with the controller based on a received second enable signal, such that the output of the flash memory module is transmitted to a corresponding one of the peripheral pins via at least one of the first control contacts and the connection between the second control contacts and the module contacts is verified based on the signal received by the peripheral pin.

15. The flash storage device according to claim 14, wherein the controller reads data from a preset address of the flash memory module and the data is transmitted from at least one of the module contacts to at least one of the control contacts of the controller when the controller receives the second enable signal.

16. The flash storage device according to claim 15, wherein the controller reads an identification of the flash memory module from the flash memory module and outputs the identification to the second control contacts in a parallel manner via the module contacts.

17. The flash storage device according to claim 13, wherein the testing steps further comprises ignoring the signal received by the test pin when the controller receives a third enable signal.

18. The flash storage device according to claim 13, wherein the instruction storage module is a boot ROM.

19. The flash storage device according to claim 13, wherein the controller controls the first control contacts to output a plurality of first test signals to the peripheral pins, respectively, when the first enable signal is one of a logic low signal and a logic high signal; the controller controls the first control contacts to output a plurality of second test signals to the peripheral pins, respectively, when the first enable signal is the other of the logic low signal and the logic high signal, wherein the second test signals are inverted signals of the first test signals; when the first enable signal is a clock signal, one of the first control contacts is sequentially set to output one of a logic high signal and a logic low signal, and each of the rest of the first control contacts is set to output the other of the logic high signal and the logic low signal.

20. The flash storage device according to claim 13, wherein the controller and the flash memory module are packaged in a same chip.

21. The flash storage device according to claim 13, wherein the controller comprises a first flash memory interface and a second flash memory interface both supporting flash memory interface signals.

22. The flash storage device according to claim 21, wherein the interface signals include a chip enable signal/CE, a command latch signal/CLE, an address latch signal/ALE, a data read control signal/RE, a data write control signal/WE, a data write protect signal/WP, a chip status signal R/B, and a plurality of data input/output signal IO.

23. A testing system comprising:
A flash storage device comprising:
a plurality of peripheral pins;
at least one test pin;
a controller comprising a test contact, a plurality of first control contacts and a plurality of second control contacts, the test contact being electrically connected to the test pin, each of the first control contacts being connected to a corresponding one of the peripheral pins;
a flash memory module comprising a plurality of module contacts, each of the module contacts being connected to a corresponding one of the second control contacts; and
an instruction storage module electrically connected to the controller and storing a plurality of machine instructions that are executable by the controller; and
a testing apparatus electrically connected to the peripheral pins and the test pin;
wherein when the testing apparatus transmits a first enable signal to the test contact via the test pin, the controller executes the machine instructions to control the first control contacts to output a plurality of test signals to the peripheral pins, respectively, based on the first enable signal, such that in the testing apparatus, whether or not the connection between the first control contacts and the peripheral pins is correct is determined based on receiving of the signals that were received by the peripheral pins, and the testing apparatus transmits a second enable signal to the test contact via the test pin when the testing apparatus verifies that the connection between the first control contacts and the peripheral pins is correct, such that in the controller, an output of the flash memory module is received via the second control contacts based on the second enable signal, and subsequently the output of the flash memory module is transmitted to a corresponding one of the peripheral pins via at least one of the first control contacts so as to verify whether or not the connection between the second control contacts and the module contacts is correct based on the output of the flash memory module.

24. The testing system according to claim 23, wherein the instruction storage module is a boot ROM.

25. The testing system according to claim 23, further comprising:
a signal converter comprising a plurality of input ends and at least one output end, the signal converter being electrically connected to the peripheral pins through the input ends and electrically connected to the testing apparatus through the output end, wherein the signal converter re-encodes the signals received by the input ends and outputs the re-encoded signals from the output end.

* * * * *